(12) United States Patent
Kim

(10) Patent No.: US 7,998,643 B2
(45) Date of Patent: Aug. 16, 2011

(54) METHOD OF CORRECTING AN ERROR IN PHASE DIFFERENCE IN A PHASE SHIFT MASK

(75) Inventor: Jong Woo Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 38 days.

(21) Appl. No.: 12/647,936

(22) Filed: Dec. 28, 2009

(65) Prior Publication Data

US 2010/0330464 A1  Dec. 30, 2010

(30) Foreign Application Priority Data

Jun. 25, 2009 (KR) .......................... 10-2009-0057014

(51) Int. Cl.
*G03F 9/00* (2006.01)
(52) U.S. Cl. .............................. 430/5; 430/30; 382/144

(58) Field of Classification Search ................ 430/5, 30; 382/144
See application file for complete search history.

(56) References Cited

U.S. PATENT DOCUMENTS

| 7,389,491 B2 | 6/2008 | Park et al. |
| 7,691,541 B2 * | 4/2010 | Crocker et al. ................... 430/5 |

* cited by examiner

*Primary Examiner* — Christopher G Young
(74) *Attorney, Agent, or Firm* — Marshall, Gerstein & Borun LLP

(57) ABSTRACT

Disclosed is a method of correcting an error in a phase difference in a phase shift mask, in which a phase shift pattern is formed on a light transmitting substrate, wherein the method includes: determining generation of an error in a phase difference by measuring a phase of a light transmitted through the light transmitting substrate and a phase of a light transmitted through the phase shift pattern; and correcting the error in the phase difference by coating a self-assembled monolayer on the light transmitting substrate when the error of the phase difference is generated.

7 Claims, 6 Drawing Sheets

| Refractive Index (n) | ArF | | KrF | |
|---|---|---|---|---|
| | Under Phase Difference | Over Phase Difference | Under Phase Difference | Over Phase Difference |
| 1.5 | 1.07 | | 1.38 | |
| 1.3 | 1.79 | | 2.30 | |
| 1.1 | 10.72 | | 13.78 | |
| 0.9 | | 10.7 | | 13.78 |
| 0.7 | | 1.79 | | 2.30 |
| 0.5 | | 1.07 | | 1.38 |

METHOD OF CORRECTING AN ERROR IN PHASE DIFFERENCE IN A PHASE SHIFT MASK

CROSS-REFERENCE TO RELATED APPLICATIONS

The application generally claims priority to Korean patent application number 10-2009-0057014, filed on Jun. 25, 2009, which is incorporated by reference in its entirety.

BACKGROUND OF THE INVENTION

The present invention relates to a photo mask used in fabrication of a semiconductor device, and more particularly to, a method of correcting an error of a phase difference in a phase shift mask.

In general, a semiconductor device includes various patterns and a photolithography process is used to form these patterns. In accordance with this photolithography process, a photoresist layer of which solubility is changed by irradiation of light is formed on a layer to be patterned on a wafer, a predetermined portion of the photoresist layer is exposed by a photo mask and then the portion of which solubility to a developing solution has been changed or not changed is removed to form a photoresist layer pattern. After that, the layer to be patterned by the photoresist layer pattern is removed through an etch to form a pattern.

However, a pattern sizes have recently been reduced as an integration degree of semiconductor devices has increased, and accordingly, a pattern defect due to a lowering in resolution and so on becomes a serious problem in the formation of the pattern using photolithography.

Accordingly, various resolution enhancement techniques capable of enhancing the resolution have been continuously developed, and among these techniques, there is a method of minimizing the pattern defect by increasing the resolution using a phase shift mask instead of an existing binary mask.

FIG. 1 is a sectional view illustrating an example of a conventional phase shift layer pattern. Referring to FIG. 1, a phase shift layer 100 has a structure in that a phase shift layer 120 is disposed, as a phase shift pattern, on a light transmitting substrate 110 such as quartz. When performing an exposure process using the phase shift mask 100, there is a phase difference of a certain degree, e.g. 180 degrees, between a light 131 transmitted through a non-phase shift region by which the light transmitting substrate 110 is exposed and a light 132 transmitted through a phase shift region on which the phase shift layer 120 is not exposed. This phase difference is generated due to a difference in a refractive index in the light transmitting substrate 110, the phase shift layer 120 and air. This is because a wavelength of the light 132 transmitted through the phase shift region is reduced when the light 132 is transmitted through the phase shift layer 120 having a relatively large refractive index, and as a result, the phase of the light 132 is inverted by 180 degrees. This phase difference causes a destructive interference in a boundary between the phase shift region and the non-phase shift region and a resolution in the pattern formation process is increased by this destructive interference.

Accordingly, to obtain an effect of the resolution increase, it is important that the phase difference of 180 degrees is shown between the light 131 transmitted through the non-phase shift region and the light 132 transmitted through the phase shift region in the process of fabricating a phase shift mask. As described above, the phase difference is dependent on the refractive indexes of the light transmitting substrate 110 and the phase shift layer 120 and is also dependent on thicknesses of the light transmitting substrate 110 and the phase shift layer 120. Accordingly, in a design of the phase shift mask, the thicknesses and refractive indexes of the light transmitting substrate 110 and the phase shift layer 120 are selected to be capable of obtaining a desired phase difference.

However, errors can be generated in the thicknesses of the light transmitting substrate 110 and the phase shift layer 120 in the process of fabricating a phase shift mask. In one example, to fabricate the phase shift mask, an etch process removes some portion of a phase shift material layer after the phase shift material layer for formation of the phase shift layer 120 on the light transmitting substrate 110. However, in this etch process, a portion of the light transmitting substrate 110 can be etched to partially reduce the thickness of the light transmitting substrate 110. Also, in the etch process, an upper face of the phase shift layer 120 can be etched to reduce the thickness of the phase shift layer 120. By influence in this etch process, when the thicknesses of the light transmitting substrate 110 and the phase shift layer 120 are changed without changing their refractive indexes, there is generated a phase difference error in which the phase difference between the light 131 transmitted through the non-phase shift region and the light 132 transmitted through the phase shift region is larger or smaller than 180 degrees, and particularly, the phase difference error over a limit error does not allow an effect of a desired resolution decrease.

Accordingly, in the prior art, when such a phase difference error is generated, a method has been used for correcting the phase difference error by implementing an additional etch process on the light transmitting substrate 110 and/or the phase shift layer 120 and adjusting the total thickness again. However, a critical dimension of the phase shift layer 120 can be damaged by the additional etch process and an overall critical dimension uniformity can also be decreased. Also, a defect due to an etch byproduct can be generated.

SUMMARY OF THE INVENTION

Embodiments of the invention are directed to a method of correcting an error in a phase difference in a phase shift mask, which allows correction of an error in a phase difference without an additional etch process.

In one embodiment, a method of correcting an error in a phase difference in a phase shift mask, in which a phase shift pattern is formed on a light transmitting substrate, includes: determining generation of an error in a phase difference by measuring a phase of a light transmitted through the light transmitting substrate and a phase of a light transmitted through the phase shift pattern; and correcting the error in the phase difference by coating a self-assembled monolayer on the light transmitting substrate when the error in the phase difference is generated.

Preferably, the determining of generation in the error of the phase difference is implemented by determining whether the error in the phase difference is an error of under phase difference or an error of over phase difference. When the error in the phase difference is the error of under phase difference, the correcting of the error in the phase difference is implemented by coating the self-assembled monolayer having a refractive index of 1.1 to 1.5 on the light transmitting substrate. When the error in the phase difference is the error of over phase difference, the correcting of the error in the phase difference is implemented by coating the self-assembled monolayer having a refractive index of 0.5 to 0.9 on the light transmitting substrate.

Preferably, the self-assembled monolayer employs a fluoro-silane based self-assembled monolayer.

Preferably, the coating of the self-assembled monolayer is implemented using a vapor phase process within a vacuum chamber or a liquid phase process within a liquid vessel.

Preferably, the self-assembled monolayer has a hydrophobic functional group.

In accordance with the invention, since an error in a phase difference is corrected by coating a self-assembled monolayer on a surface of a light transmitting substrate when the error in a phase difference is generated, an additional etch process for correcting the error of a phase difference is not necessary. Particularly, since the functional group of the self-assembled monolayer has hydrophobia, it is possible to prevent generation of foreign substances on a surface of the phase shift mask.

DESCRIPTION OF SPECIFIC EMBODIMENTS

Hereinafter, a method for fabricating a photomask in accordance with the invention is described in detail with reference to the accompanying drawings.

Figure 1:
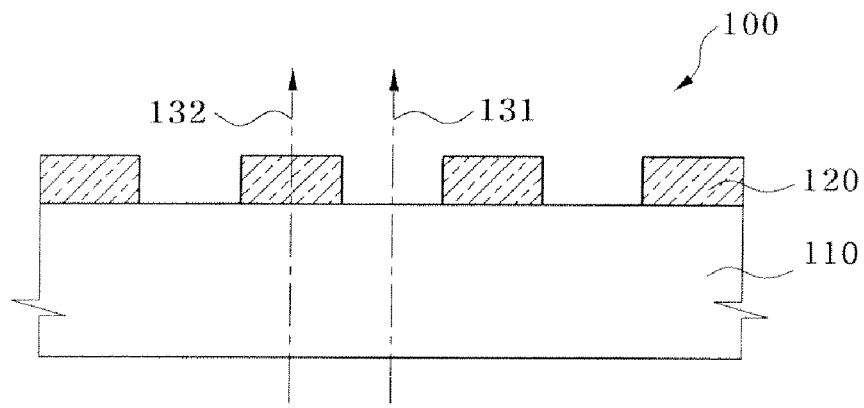
FIG. 1 is a sectional view illustrating an example of a conventional phase shift layer pattern.
Figure 2:
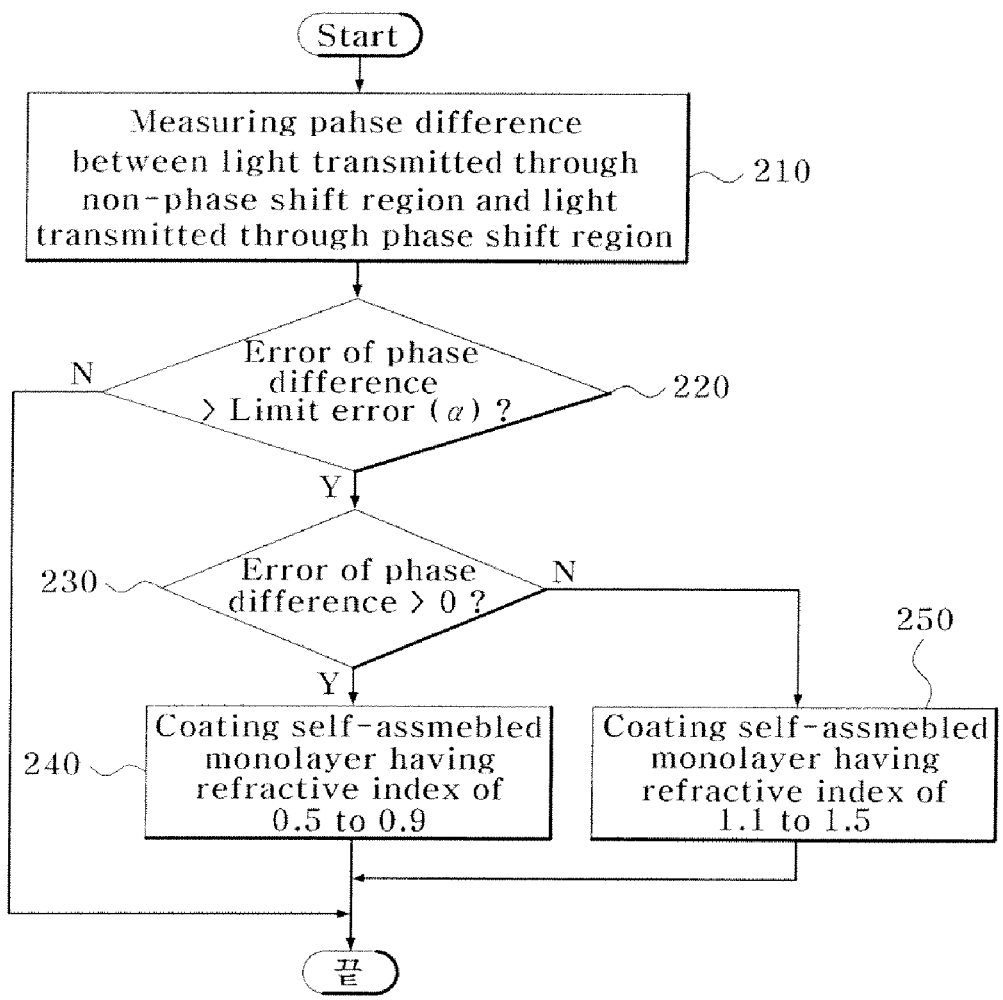
FIG. 2 is a flowchart illustrating a method of correcting an error in a phase difference in a phase shift mask in accordance with an embodiment of the invention.

FIG. 2 is a flowchart illustrating a method of correcting an error in a phase difference in a phase shift mask in accordance with an embodiment of the invention. Also, FIGS. 3 through 7 are sectional views illustrating the steps of FIG. 2.

Figure 3:
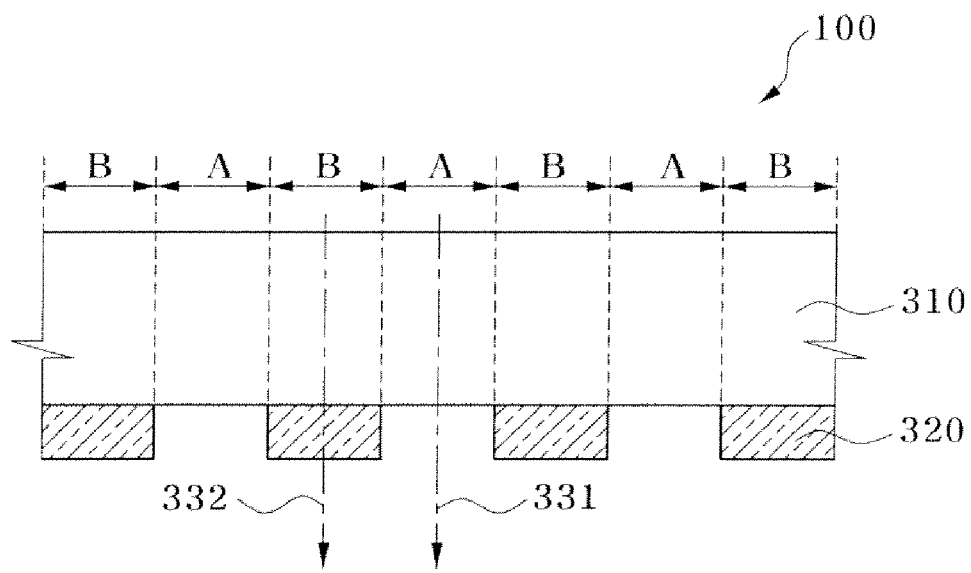
FIGS. 3 through 7 are sectional views illustrating the steps of FIG. 2.

Referring to FIG. 2 together with FIGS. 3 through 7, phase difference between light transmitted through a non-phase shift region and light transmitted through a phase shift region of a phase shift mask in which a phase shift layer is formed on a light transmitting layer as a phase shift pattern is measured. (block 210). Specifically, as illustrated in FIG. 3, light 331 and light 332 are transmitted through the phase shift mask, in which a phase shift layer 320 is formed on a light transmitting substrate 310, from a side opposite to the side on which the phase shift layer 320 is disposed. In one example, the light transmitting substrate 310 is made of quartz, and in this case, a refractive index of the light transmitting substrate 310 is about 1.5. The phase shift layer 320 is made of molybdenum silicon nitride (MoSiN), and in this case, a refractive index of the phase shift layer 320 is about 206. In a normal condition, due to this difference in the refractive index, a phase difference of a certain angle, e.g. 180 degrees is generated between the light 331 transmitted through a non-phase shift region A in which the light transmitting substrate 310 is exposed and the light 332 transmitted through a phase shift region B in which the phase shift layer 320 is disposed. Accordingly, at block 210, it is possible to measure the phase difference between the light 331 transmitted through the non-phase shift region A and the light 332 transmitted through the phase shift region B and determine from the result whether or not an error of the phase difference is generated.

Next, it is determined whether or not the error of the phase difference is greater than a limit error $\alpha$. (block 220). Herein, the error of the phase difference means a deviation degree of the phase difference between the light transmitted through the non-phase shift region and the light transmitted through the phase shift region from 180 degrees. Accordingly, the error of the phase difference greater than the limit error $\alpha$ means that the measured phase difference is out of 180±$\alpha$ degrees.

Figure 4:
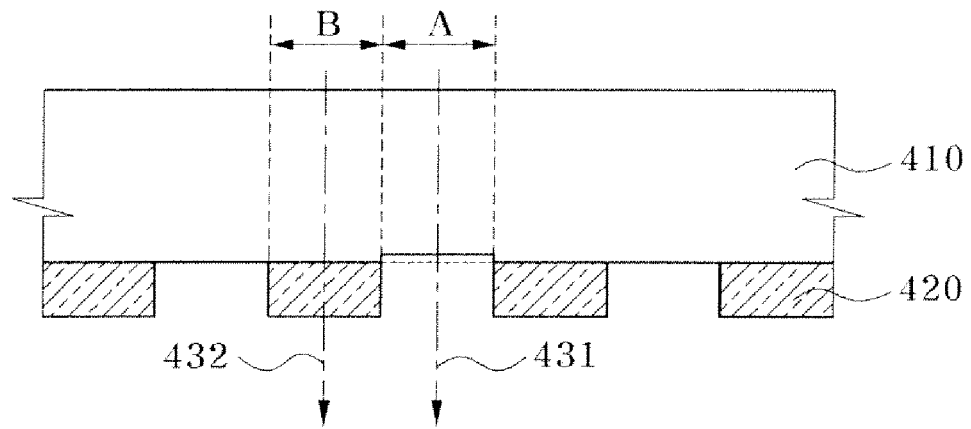

There can be various causes for the generation in the error of the phase difference. In one example, as illustrated in FIG. 4, the error in the phase difference is generated because a portion of the light transmitting substrate 410 is etched. That is to say, the thickness of the phase shift layer 420 remains, but the thickness of some portion of the light transmitting substrate 410 becomes smaller than a normal thickness when the portion of the light transmitting substrate 410 is etched to have a surface lower than a normal surface indicated by a dotted line. As a result, the phase difference between the light 431 transmitted through this portion and the light 432 transmitted through the phase shift region B is shown to be smaller than 180 degrees, and correction of the error in the phase difference is required when the error is over the limit error $\alpha$.

Figure 5:
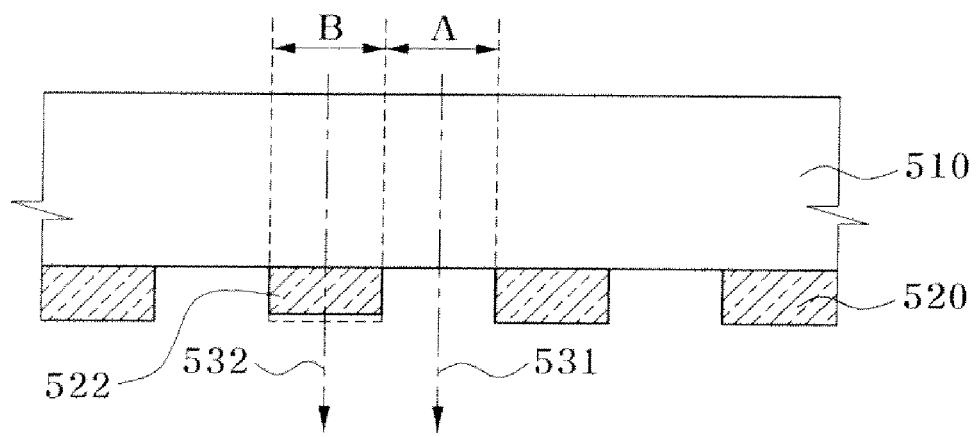

In another example of a possible cause of the error in the phase difference, as illustrated in FIG. 5, the error in the phase difference can be generated because some phase shift layer 522 of the phase shift layers 520 is excessively etched. In this case the thickness of the light transmitting substrate 510 remains, but the thickness of the phase shift layer 522 is decreased in comparison to a normal thickness. As a result, the phase difference between the light 431 transmitted through this portion and the light 432 transmitted through the phase shift region B is shown to be greater than 180 degrees. In this case, the correction in the error of the phase difference is also required when the error is over the limit error $\alpha$.

A process of correcting the error in the phase difference is varied depending on whether the error in the phase difference has a positive value or a negative value, and because of this reason, whether the error in the phase difference has a positive value or a negative value is first determined when the error in the phase difference is over the limit error $\alpha$, i.e. when the error in the phase difference is required to be corrected. (block 230). The error in the phase difference of a negative value means that when the phase difference based on the light 431 transmitted through the non-phase shift region A is smaller than 180 degree over the limit error $\alpha$ as described with reference to FIG. 4. The error in the phase difference of a positive value means that when the phase difference based on the light 531 transmitted through the non-phase shift region A is greater than 180 degree over the limit error $\alpha$ as described with reference to FIG. 5.

Figure 6:
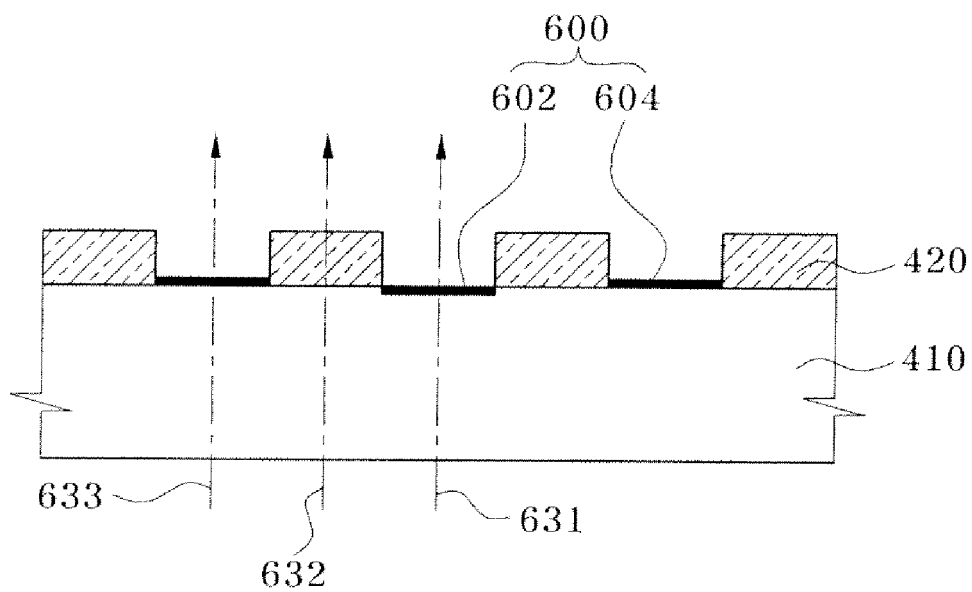

When the error in the phase difference has a positive value from the result of the determination in block 230, as illustrated in FIG. 6, a self-assembled monolayer 600 having a refractive index of 0.5 to 0.9 is coated on the light transmitting substrate 410 to correct the error in the phase difference. (block 240) A thickness of the self-assembled monolayer 600 can vary as a magnitude of the error to be corrected. The self-assembled monolayer 600 includes a self-assembled monolayer 602 coated on a portion where the error of the phase difference is generated and a self-assembled monolayer 604 is coated on a normal portion of the light transmitting substrate 410. In this case, the error in the phase difference between the light 631 transmitted through the portion where the error in the phase difference is generated and the light transmitted through the phase shift layer 420 is corrected by the self-assembled monolayer 602 coated on a portion where the error in the phase difference is generated, but an error in the phase difference can be generated between the light 633 transmitted through the normal portion and the light transmitted through the phase shift layer 520 by the self-assembled monolayer 604. Accordingly, the thickness of the self-assembled monolayer 600 is adjusted properly to make the error in the phase difference between the light 633 transmitted through the normal portion and the light transmitted through the phase shift layer 520 less than the limit error α.

Figures 7, 8:
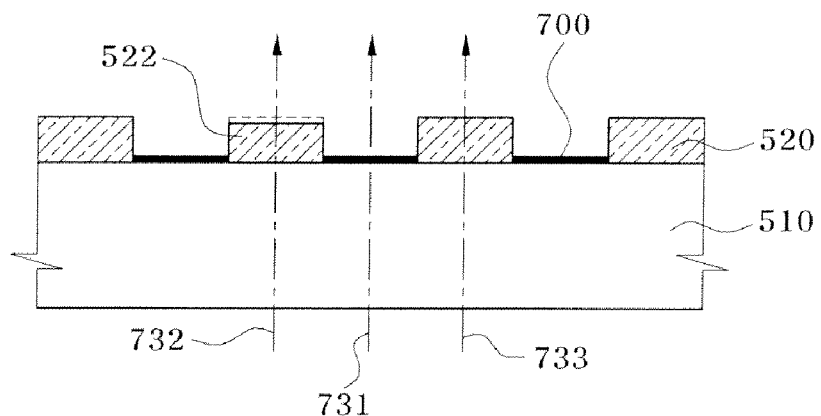
FIG. 8 is a table showing a thickness of the self-assembled monolayer according to the refractive index.

When the error in the phase difference has a negative value from the result of the determination made in the block 230, as illustrated in FIG. 7, a self-assembled monolayer 700 having a refractive index of 1.1 to 1.5 is coated on the light transmitting substrate 510 to correct the error of the phase difference. (block 250). A thickness of the self-assembled monolayer 700 can vary as a magnitude of the error to be corrected. Also in this case, the error in the phase difference between the light 731 transmitted through the portion coated with the self-assembled monolayer 700 and the light transmitted through the excessively etched phase shift layer 522 is corrected by the self-assembled monolayer 700, but an error in the phase difference can be generated between the light 633 transmitted through the portion coated with the self-assembled monolayer 700 and the light transmitted through the normal phase shift layer 520. Accordingly, the thickness of the self-assembled monolayer 700 is also adjusted properly to make the error in the phase difference between the light 733 transmitted through the normal phase shift layer 520 and the light transmitted through the self-assembled monolayer 700 less than the limit error α.

FIG. 8 is a table showing a thickness of the self-assembled monolayer according to the refractive index. Specifically, the table in FIG. 8 shows the thickness (nm) of the self-assembled monolayer, which corrects the error in the phase difference by 1 degree, according to the refractive index (n) in cases of under phase difference and over phase difference when using an ArF light source and a KrF light source, respectively. Herein, the under phase difference means that the error in the phase difference has a negative value as described with reference to FIGS. 5 and 7. Also, the over phase difference means that the error in the phase difference has a positive value as described with reference to FIGS. 4 and 6. In an example of the under phase difference with an ArF light source, when correcting the error in the phase difference by coating the self-assembled monolayer having a refractive index of 1.3, a self-assembled monolayer having a thickness of 1.79 nm should be coated to correct an error in phase difference of 1 degree. Accordingly, in this case, the error in the phase difference of 4 degrees can be corrected by coating the self-assembled monolayer of 7.17 nm thickness.

Figure 9A:
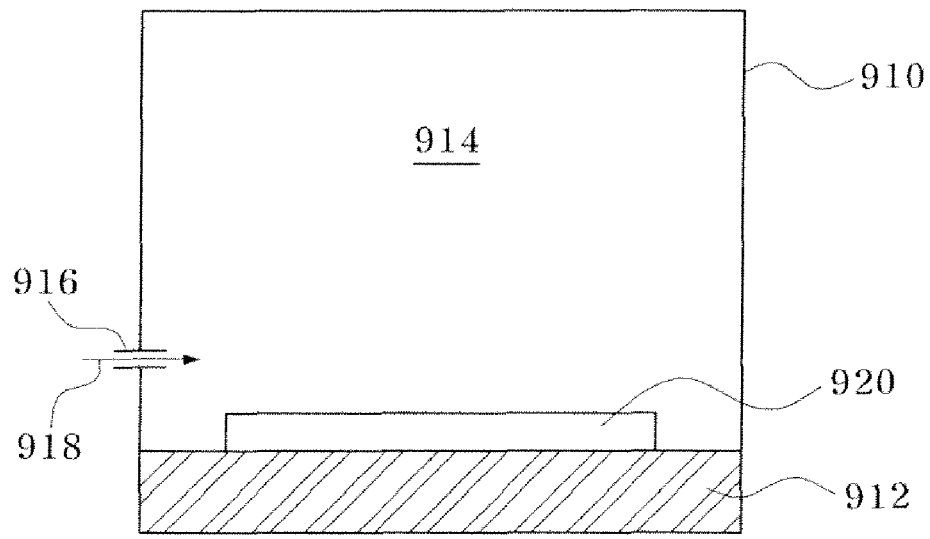
FIGS. 9A and 9B illustrate a method of coating the self-assembled monolayer.
Figure 9B:
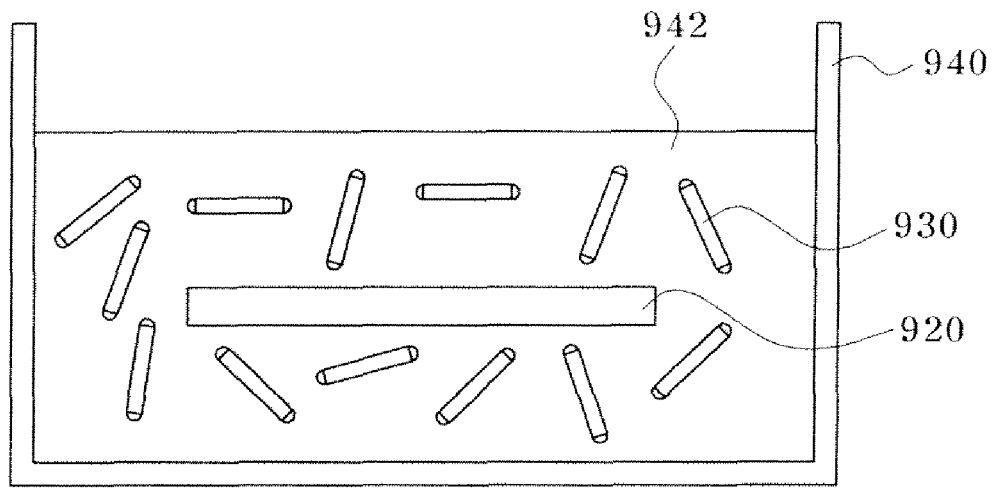

FIGS. 9A and 9B illustrate a method of coating the self-assembled monolayer. First, as illustrated in FIG. 9A, the coating of the self-assembled monolayer can be implemented using a vapor phase process within a vacuum chamber. Specifically, the phase shift mask 920 is loaded on a plate 912 of a chamber in which an internal reaction space 914 is defined. Air is discharged to create a vacuum in the internal reaction space 914, and then a precursor for the self-assembled monolayer is supplied to the inside of the internal reaction space 914 through a gas supply nozzle 916. Then, a self-assembled monolayer is coated on a surface of the photomask, particularly, on a surface of the light transmitting substrate. If necessary, a temperature of the phase shift mask 920 can be raised above a predetermined temperature through the plate 912 to activate the coating of the self-assembled monolayer.

The coating of the self-assembled monolayer can be implemented using a liquid phase process within a liquid vessel as illustrated in FIG. 9B. Specifically, a solution 942 containing self-assembling molecules 930 is received in the liquid vessel 940 and the phase shift mask 920 is dipped in the solution 942. Then, the self-assembling molecules 930 are reacted with a component of the surface of the light transmitting substrate and thus the self-assembled monolayer is coated. When coating the self-assembled monolayer using the vapor phase process or liquid phase process, it is possible to activate the surface by irradiating ultraviolet rays on the light transmitting substrate before implementing the coating and thus enhance reactivity between the self-assembled monolayer and the light transmitting substrate.

Figure 10:
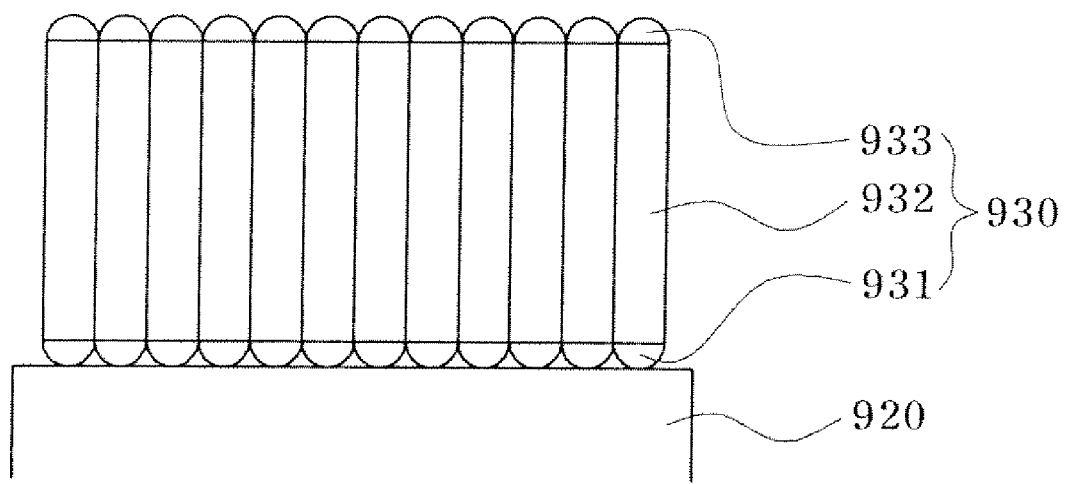
FIG. 10 illustrates the self-assembled monolayer coated on the light transmitting substrate.

FIG. 10 illustrates the self-assembled monolayer coated on the light transmitting substrate. Referring to FIG. 10, the self-assembled monolayer 930 coated on the light transmitting substrate in the phase shift mask 920 consists of head groups 931, hydrocarbon chains 932 and terminal groups 933. The head groups 931 are the portion chemically absorbed to the surface of the light transmitting substrate; and the hydrocarbon chains 932 are alkyl chains and have a monolayer due to Van Der Waals interaction between the long chains. Also, the terminal groups 933 are the portion of a functional group and can be variously replaced according to use. In an embodiment of the invention, a silane-based group is used for the head group 931 of the self-assembled monolayer 930. The silane-based head group 931 has a good reactivity with —OH group and thus is easily chemically absorbed to the surface of the light transmitting substrate made of quartz. A fluoro-based functional group is used for the terminal group 933 of the self-assembled monolayer 930. The fluoro-based functional group reduces a surface energy of the coated surface and is hydrophobic, and thus prevents contaminants from being attached on the surface of the phase shift mask. An example for the silane-fluoro based self-assembled monolayer 930 includes perfluoroalkylsilane (CF3(CF2)7CH2CH2Si(OMe)3).

While the present invention has been described with respect to the specific embodiments, it will be apparent to those skilled in the art that various changes and modifications may be made without departing from the spirit and scope of the invention as defined in the following claims.

What is claimed is:

1. A method of correcting an error in a phase difference in a phase shift mask, in which a phase shift pattern is formed on a light transmitting substrate, wherein the method comprises:
    determining generation of an error in a phase difference by measuring a phase of a light transmitted through the light transmitting substrate and a phase of a light transmitted through the phase shift pattern; and
    correcting the error in the phase difference by coating a self-assembled monolayer on the light transmitting substrate when the error in the phase difference is generated.

2. The method of claim 1, wherein the determining of generation of the error in the phase difference is implemented by determining whether the error in the phase difference is an error of under phase difference or an error of over phase difference.

3. The method of claim 2, wherein when the error in the phase difference is the error of under phase difference, the correcting of the error in the phase difference is implemented by coating the self-assembled monolayer having a refractive index of 1.1 to 1.5 on the light transmitting substrate.

4. The method of claim 2, wherein when the error in the phase difference is the error of over phase difference, the correcting of the error in the phase difference is implemented by coating the self-assembled monolayer having a refractive index of 0.5 to 0.9 on the light transmitting substrate.

5. The method of claim 1, wherein the self-assembled monolayer employs a fluoro-silane based self-assembled monolayer.

6. The method of claim 1, wherein the coating of the self-assembled monolayer is implemented using a vapor phase process within a vacuum chamber or a liquid phase process within a liquid vessel.

7. The method of claim 1, wherein the self-assembled monolayer has a hydrophobic functional group.

* * * * *